United States Patent
Hsu

(10) Patent No.: US 10,607,059 B2
(45) Date of Patent: Mar. 31, 2020

(54) METHOD FOR ASSEMBLING FINGERPRINT IDENTIFICATION MODULE

(71) Applicant: Primax Electronics Ltd., Taipei (TW)

(72) Inventor: Chih-Hao Hsu, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 81 days.

(21) Appl. No.: 15/991,067

(22) Filed: May 29, 2018

(65) Prior Publication Data

US 2019/0294854 A1 Sep. 26, 2019

(30) Foreign Application Priority Data

Mar. 23, 2018 (TW) .................................. 107110094

(51) Int. Cl.
G06K 9/20 (2006.01)
G06K 9/00 (2006.01)
H05K 13/04 (2006.01)
H05K 13/00 (2006.01)

(52) U.S. Cl.
CPC ......... *G06K 9/00053* (2013.01); *H05K 13/00* (2013.01); *H05K 13/046* (2013.01)

(58) Field of Classification Search
CPC .. G06K 9/00053; G06K 9/00006–0012; H01L 21/6836; H01L 21/78–86; H05K 13/00–029
See application file for complete search history.

(56) References Cited

U.S. PATENT DOCUMENTS 9,514,925 B1 * 12/2016 Tam .................... H01L 21/78
2016/0350575 A1 * 12/2016 Kim .................... H01L 23/04
2019/0102596 A1 * 4/2019 Suzuki ................ G06K 9/0004

* cited by examiner

*Primary Examiner* — Brian Werner
(74) *Attorney, Agent, or Firm* — Kirton McConkie; Evan R. Witt

(57) ABSTRACT

A method for assembling a fingerprint identification module includes the following steps. Firstly, a first spray process is performed to form a first paint structure on a first surface of a sensing strip. Then, a first surface and a second surface of the sensing strip are protected. Then, a periphery region of the sensing strip is cut. Consequently, plural fingerprint sensors are produced, and the fat edge structures generated in the first spray process are eliminated. Then, a second spraying process is performed to spray a second paint structure is sprayed on sidewalls of the plural fingerprint sensors. Then, the cut first protective film and the cut second protective layer are removed from the fingerprint sensors. Consequently, the color of the first surface of the fingerprint sensor is identical to the color of the sidewall of the fingerprint sensor.

9 Claims, 5 Drawing Sheets

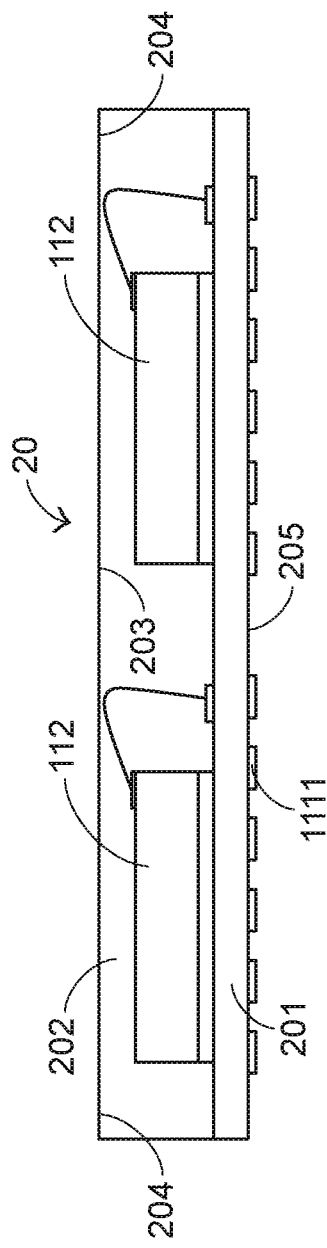
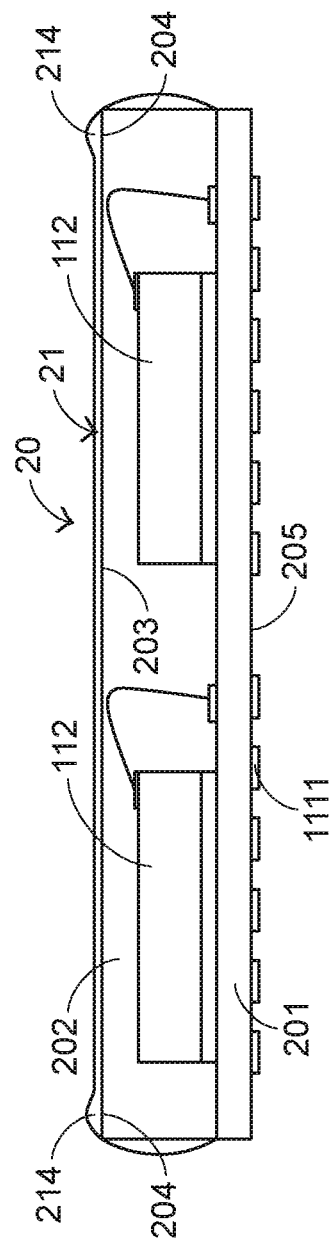
FIG.3
FIG.4

METHOD FOR ASSEMBLING FINGERPRINT IDENTIFICATION MODULE

FIELD OF THE INVENTION

The present invention relates to an assembling method, and more particularly to a method for assembling a fingerprint identification module.

BACKGROUND OF THE INVENTION

Recently, a fingerprint identification technology has been applied to a variety of electronic products. By using the fingerprint identification technology, the user's fingerprint can be inputted into an electronic product and saved in the electronic product. For unlocking the electronic product, the user has to input the fingerprint through a fingerprint identification module. The way of unlocking the electronic product by the fingerprint identification technology is faster and more user-friendly than the way of manually inputting the password. Consequently, the fingerprint identification technology is favored by many users, and the demands on the fingerprint identification module are gradually increased.

Generally, a fingerprint identification module comprises a fingerprint sensor, a protective cover and a circuit board. The fingerprint sensor is disposed on and electrically connected with the circuit board. The fingerprint sensor is used for sensing the user's finger and acquiring the information of the user's finger. The protective cover is used for covering the fingerprint sensor in order to protect the fingerprint sensor. The user's finger is only permitted to touch the protective cover. Since the user's finger is not directly contacted with the fingerprint sensor, the fingerprint sensor is not easily damaged. However, the cost of the protective cover is high. For reducing the fabricating cost of the fingerprint identification module, a paint material is sprayed on the fingerprint sensor to form a paint structure. The fingerprint sensor is covered and protected by the paint structure.

Generally, the fingerprint identification module is installed on an electronic device such as a smart phone or a tablet computer, and the fingerprint identification module is partially exposed outside a casing of the electronic device. Consequently, the fingerprint identification module can be operated by the user. Moreover, the color of the fingerprint identification module and the color of the casing of the electronic device are usually different. For achieving an aesthetically-pleasing appearance, it is preferred that the color of the fingerprint identification module and the color of the casing of the electronic device are identical. In other words, the paint used in the paint-spraying process has the same color as the casing of the electronic device.

However, because of the surface tension, the paint distributed on the fingerprint sensor generates a fat edge structure on the periphery region of the fingerprint sensor. Consequently, the appearance of the fingerprint identification module is impaired.

Therefore, there is a need of providing a method for assembling a fingerprint identification module with aesthetically-pleasing appearance.

SUMMARY OF THE INVENTION

The present invention provides a method for assembling a fingerprint identification module with aesthetically-pleasing appearance.

In accordance with an aspect of the present invention, there is provided a method for assembling a fingerprint identification module. The method includes the following steps. In a step (A), a first paint structure is sprayed on a first surface of a sensing strip. In a step (B), a first protective film is covered on the first surface of the sensing strip, and a second protective film is covered on a second surface of the sensing strip. In a step (C), the sensing strip is cut to produce plural fingerprint sensors. In a step (D), a second paint structure is sprayed on sidewalls of the plural fingerprint sensors. In a step (E), the cut first protective film and the cut second protective layer are removed from the fingerprint sensors.

In an embodiment, the step (A) includes steps (A1), (A2) and (A3). In the step (A1), a first primer layer of the first paint structure is sprayed on the first surface of the sensing strip. In a step (A2), a first color paint layer of the first paint structure is sprayed on the first primer layer. In a step (A3), a first topcoat paint layer of the first paint structure is sprayed on the first color paint layer.

In an embodiment, the second paint structure contains a second color paint layer. A color of the second color paint layer is identical to a color of the first color paint layer.

From the above descriptions, the present invention provides a method for assembling a fingerprint identification module. Firstly, a first spray process is performed to form a first paint structure on a first surface of a sensing strip. Then, a first surface and a second surface of the sensing strip are protected. Then, a periphery region of the sensing strip is cut. Consequently, plural fingerprint sensors are produced, and the fat edge structures generated in the first spray process are eliminated. Then, a second spraying process is performed to spray a second paint structure is sprayed on sidewalls of the plural fingerprint sensors. Consequently, the overall color of the fingerprint sensor is uniform. Then, the cut first protective film and the cut second protective layer are removed from the fingerprint sensors. After one of the fingerprint sensors is installed on a circuit board, the fingerprint identification module is produced.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 3 is a schematic cross-sectional view illustrating a sensing strip of the fingerprint identification module according to the embodiment of the present invention;

FIG. 4 is a schematic cross-sectional view illustrating the sensing strip of the fingerprint identification module after a first paint structure is sprayed on the sensing strip;

DETAILED DESCRIPTION OF THE PREFERRED EMBODIMENT

For solving the drawbacks of the conventional technologies, the present invention provides a method for assembling a fingerprint identification module.

Figure 1:
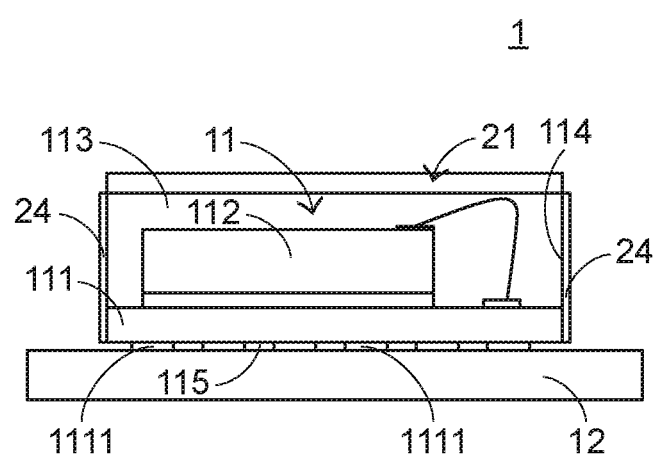
FIG. 1 is a schematic view illustrating a fingerprint identification module according to an embodiment of the present invention.

FIG. 1 is a schematic view illustrating a fingerprint identification module according to an embodiment of the present invention. As shown in FIG. 1, the fingerprint identification module 1 comprises a fingerprint sensor 11 and a circuit board 12. The fingerprint sensor 11 is fixed on the circuit board 12. In an embodiment, the fingerprint sensor 11 has a land grid array (LGA) package structure, and the circuit board 12 is a flexible printed circuit (FPC) or a rigid-flex board.

The fingerprint sensor 11 comprises a substrate 111, plural sensing dies 112 and an encapsulation layer 113. The substrate 111 comprises plural electric contact parts 1111. The electric contact parts 1111 are disposed on a bottom surface of the substrate 111. That is, the electric contact parts 1111 are disposed on a bottom surface 115 of the fingerprint sensor 11. The plural sensing dies 112 are disposed on the substrate 111 and connected with the substrate 111 by a wire bonding process. The plural sensing dies 112 and a top surface of the substrate 111 are encapsulated by the encapsulation layer 113. In an embodiment, the encapsulation layer 113 is made of an epoxy molding compound (EMC).

Figure 2:
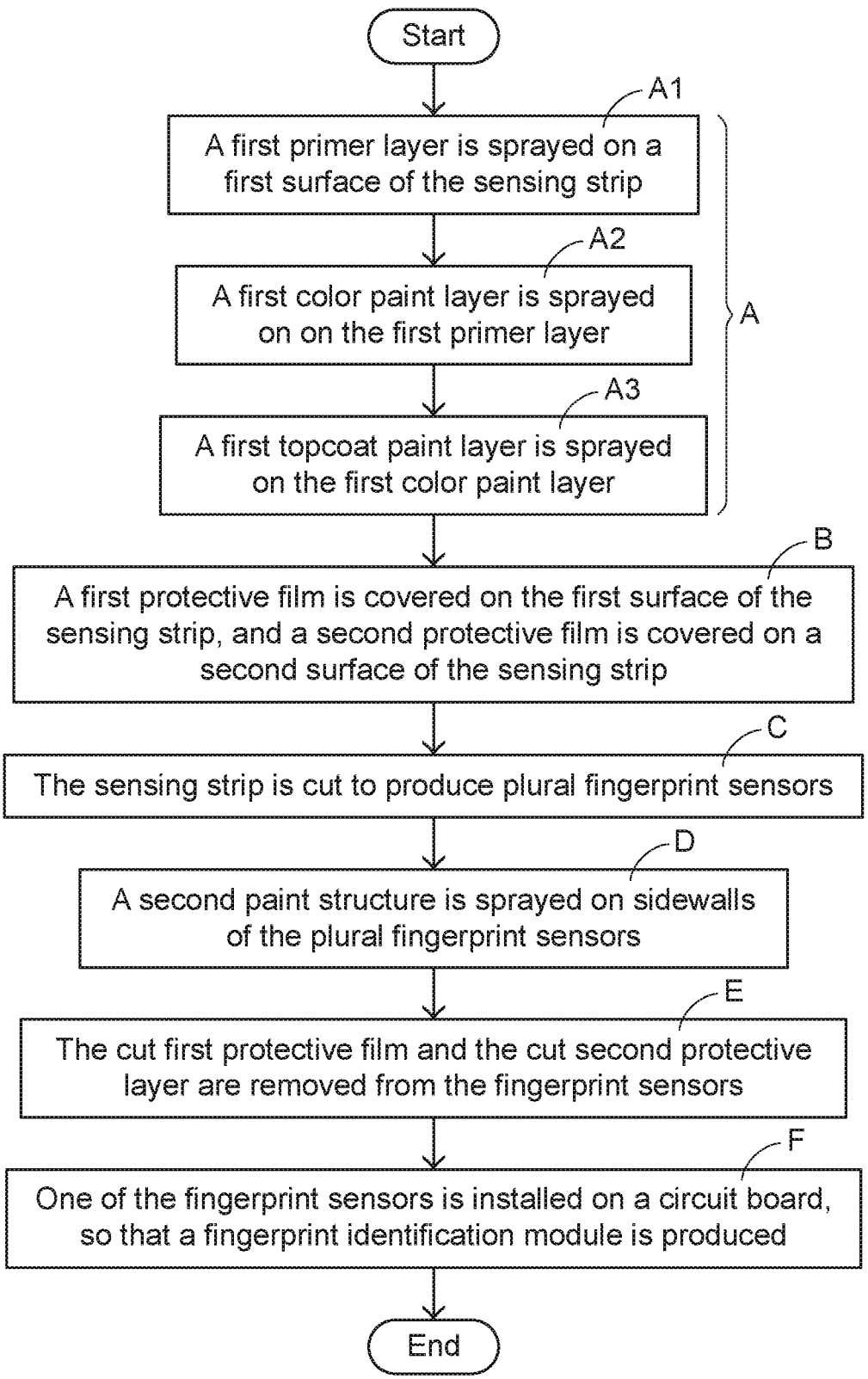
FIG. 2 schematically illustrates a flowchart of a method for assembling a fingerprint identification module according to an embodiment of the present invention.

A method for assembling the fingerprint identification module will be described as follows. FIG. 2 schematically illustrates a flowchart of a method for assembling a fingerprint identification module according to an embodiment of the present invention. The method comprises the following steps.

In a step A, a first paint structure sprayed is sprayed on a first surface of a sensing strip.

In a step B, a first protective film is covered on the first surface of the sensing strip, and a second protective film is covered on a second surface of the sensing strip.

In a step C, the sensing strip is cut to produce plural fingerprint sensors.

In a step D, a second paint structure is sprayed on sidewalls of the plural fingerprint sensors.

In a step E, the cut first protective film and the cut second protective layer are removed from the fingerprint sensors.

In a step F, one of the fingerprint sensors is installed on a circuit board, so that a fingerprint identification module is produced.

The step A comprises steps A1, A2 and A3. In the step A1, a first primer layer of the first paint structure is sprayed on the first surface of the sensing strip. In the step A2, a first color paint layer of the first paint structure is sprayed on the first primer layer. In the step A3, a first topcoat paint layer of the first paint structure is sprayed on the first color paint layer.

Figure 5:
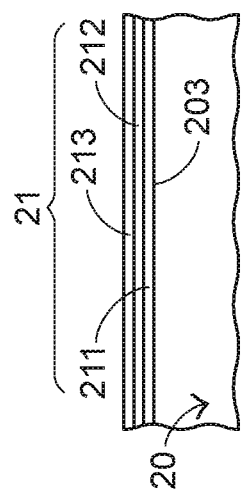
FIG. 5 is a schematic cross-sectional view illustrating portions of the first paint structure and the sensing strip of the fingerprint identification module according to the embodiment of the present invention.

Hereinafter, the operations of the method for assembling the fingerprint identification module will be illustrated with reference to FIGS. 3, 4 and 5. FIG. 3 is a schematic cross-sectional view illustrating a sensing strip of the fingerprint identification module according to the embodiment of the present invention. FIG. 4 is a schematic cross-sectional view illustrating the sensing strip of the fingerprint identification module after a first paint structure is sprayed on the sensing strip. FIG. 5 is a schematic cross-sectional view illustrating portions of the first paint structure and the sensing strip of the fingerprint identification module according to the embodiment of the present invention.

After the method for assembling the fingerprint identification module in the production line is started, the step A is performed. That is, a first paint structure 21 is formed on a first surface 203 of a sensing strip 20. In FIG. 4, the structure of the sensing strip 20 is shown. The sensing strip 20 comprises a strip substrate 201, plural sensing dies 112 and a strip encapsulation layer 202. The plural sensing dies 112 are disposed on the strip substrate 201 and connected with the strip substrate 201 by a wire bonding process. The plural sensing dies 112 and a top surface of the strip substrate 201 are encapsulated by the strip encapsulation layer 202. Moreover, as shown in FIG. 5, the first paint structure 21 comprises a first primer layer 211, a first color paint layer 212 and a first topcoat paint layer 213.

The step A comprises the steps A1, A2 and A3. Firstly, in the step A1, the first primer layer 211 is sprayed on the first surface 203 of the sensing strip 20. Then, in the step A2, the first color paint layer 212 is sprayed on the first primer layer 211. Consequently, the sensing strip 20 exhibits the color of the first color paint layer 212. Then, in the step A3, the first topcoat paint layer 213 is sprayed on the first color paint layer 212 to protect the first color paint layer 212. After the step A is completed, the first paint structure 21 is covered on the first surface 203 of a sensing strip 20. However, due to the surface tension, the first paint structure 21 generates plural fat edge structures 214 on a periphery region 204 of the sensing strip 20 (see FIG. 4). Preferably, the fingerprint identification module 2 is applied to an electronic device (not shown), and the color of the first color paint layer 212 is identical to the color of a casing of the electronic device.

Figure 6:
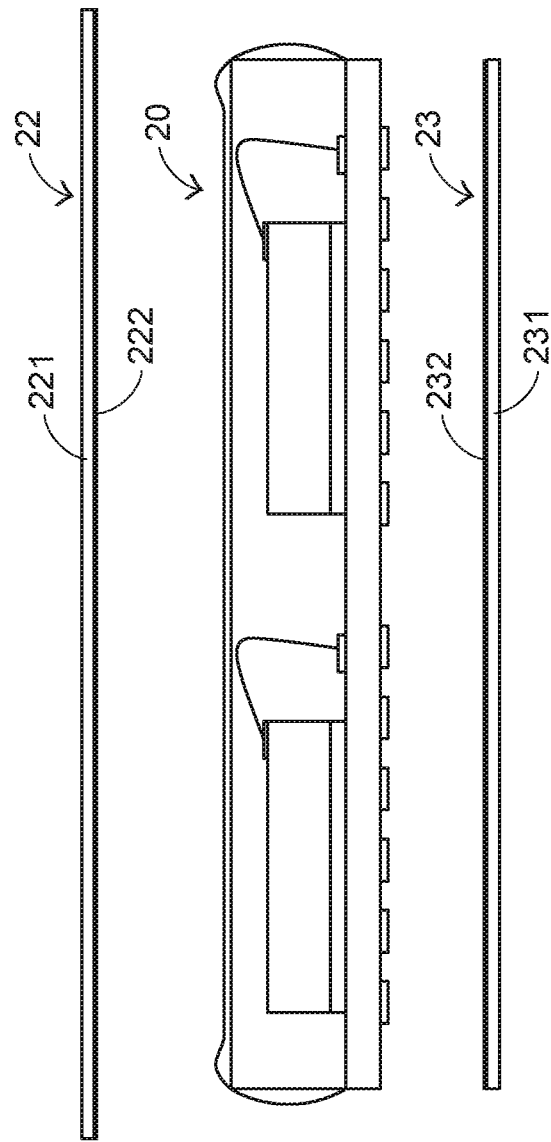
FIG. 6 is a schematic exploded view illustrating the sensing strip, a first protective film and a second protective layer of the fingerprint identification module according to the embodiment of the present invention.

Please refer to FIGS. 3 and 6. FIG. 6 is a schematic exploded view illustrating the sensing strip, a first protective film and a second protective layer of the fingerprint identification module according to the embodiment of the present invention. After the step A is completed, the first protective film 22 and the second protective layer 23 are prepared. The structures of the first protective film 22 and the second protective layer 23 are shown in FIG. 6. The first protective film 22 comprises a first thin film body 221 and a first adhesive layer 222. The first thin film body 221 is contacted with the first surface 203 of the sensing strip 20. The first adhesive layer 222 is distributed on the first thin film body 221. The first thin film body 221 is adhered to the first surface 203 of the sensing strip 20 through the first adhesive layer 222. Similarly, the second protective layer 23 comprises a second thin film body 231 and a second adhesive layer 232. The second thin film body 231 is contacted with the second surface 205 of the sensing strip 20. The second adhesive layer 232 is distributed on the second thin film body 231. The second thin film body 231 is adhered to the second surface 205 of the sensing strip 20. In an embodiment, the first thin film body 221 and the second thin film body 231 are made of polyimide (PI) or polyethylene terephthalate (PET), and the first adhesive layer 222 and the second adhesive layer 232 are made of silicone.

Figure 7:
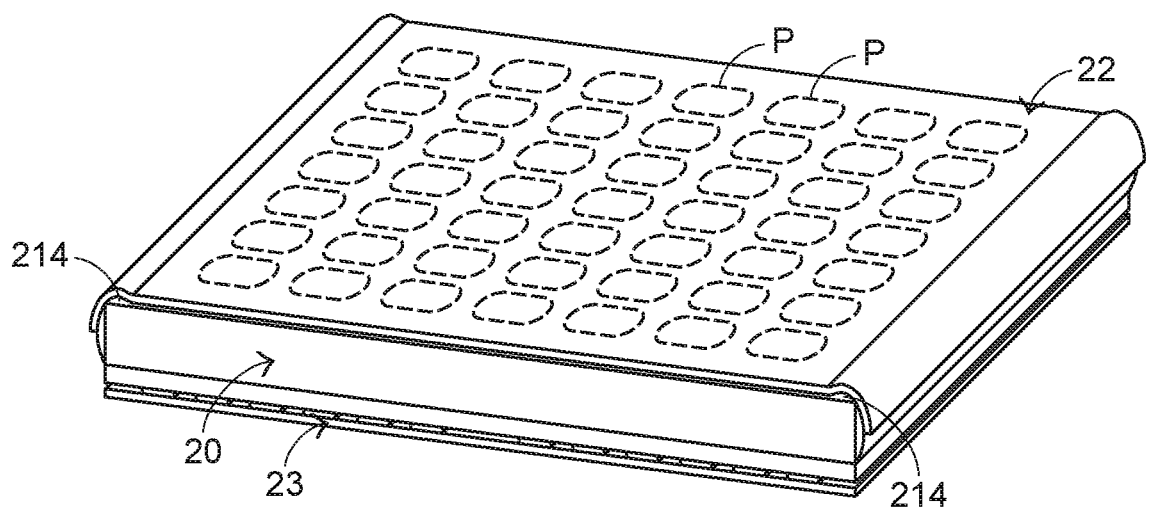
FIG. 7 is a schematic perspective view illustrating the sensing strip of the fingerprint identification module before being cut.
Figure 8:
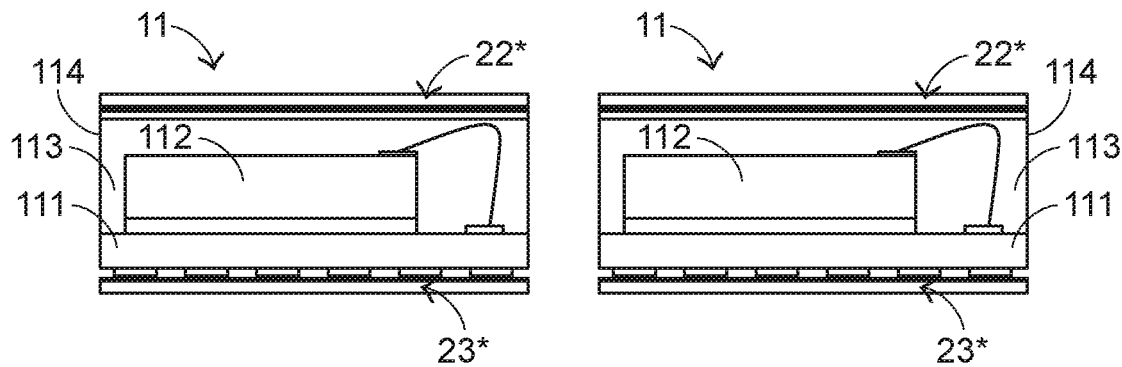
FIG. 8 is a schematic perspective view illustrating the sensing strip of the fingerprint identification module after being cut.

Then, the step B is performed. That is, the first protective film 22 is adhered and covered on the first surface 203 of the sensing strip 20, and the second protective film 23 is adhered and covered on the second surface 205 of the sensing strip 20. Please refer to FIGS. 2, 7 and 8. FIG. 7 is a schematic perspective view illustrating the sensing strip of the fingerprint identification module before being cut. FIG. 8 is a schematic perspective view illustrating the sensing strip of the fingerprint identification module after being cut. After the step B is completed, the step C is performed to cut the sensing strip 20. Consequently, plural fingerprint sensors 11 are produced. Before the cutting process, the positioning locations P (see FIG. 7) of the sensing strip 20 to be cut should be recognized in advance. Generally, the sensing strip 20 comprises plural positioning reference points to indicate the positions of the plural sensing dies 112 of the sensing strip 20. Consequently, the positioning locations P of the sensing strip 20 to be cut can be determined. The positioning reference points and the cutting process are well known to those skilled in the art, and are not redundantly described herein.

In the step C, any physical knife or any cutting tool (e.g., a laser cutter) may be employed to cut the sensing strip 20. During the cutting process, the periphery region 204 of the sensing strip 20 is cut off and thus the fat edge structures 214 are eliminated. After the cutting process is performed, the structure of the fingerprint sensor 11 is shown in FIG. 8. Meanwhile, a top surface and a bottom surface of each fingerprint sensor 11 are covered by the cut first protective film 22* and the cut second protective layer 23*, respectively. In other words, only plural sidewalls 114 of the fingerprint sensor 11 are exposed outside.

Figure 9:
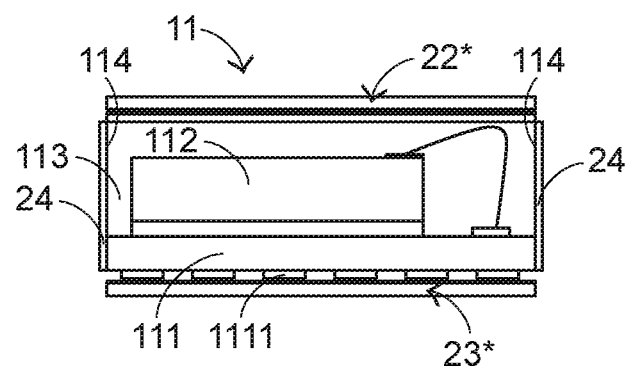
FIG. 9 is a schematic cross-sectional view illustrating the fingerprint sensor of the fingerprint identification module after a second paint structure is sprayed on the fingerprint sensor.

FIG. 9 is a schematic cross-sectional view illustrating the fingerprint sensor of the fingerprint identification module after a second paint structure is sprayed on the fingerprint sensor. Please refer to FIGS. 1, 2 and 9. After the plural fingerprint sensors 11 are produced, the step D is performed. That is, a second paint structure 24 is sprayed on the sidewalls 114 of the plural fingerprint sensors 11 (see FIG. 9). In this embodiment, the second paint structure 24 contains a second color paint layer. The color of the second color paint layer is identical to the color of the first color paint layer 212. Consequently, the color of the top surface of the fingerprint sensor 11 is identical to the color of the sidewalls 114 of the fingerprint sensor 11.

Then, the step E is performed. The cut first protective film 22* and the cut second protective layer 23* are removed from the fingerprint sensors 11. Afterwards, the step F is performed. After one of the plural fingerprint sensors 11 is installed on a corresponding circuit board 12, the fingerprint identification module 1. As shown in FIG. 1, the second surface (i.e., the bottom surface) of the fingerprint sensor 11 is installed on the circuit board 12 by a surface mount technology (SMT). Consequently, the plural electric contact parts 1111 on the second surface of the fingerprint sensor 11 are electrically connected with the circuit board 12. The overall color of the fingerprint identification module 1 fabricated by the method of the present invention is identical to the color of the casing of the electronic device. Moreover, the fingerprint identification module 1 does not have the fat edge structures.

The following three aspects should be specially described. Firstly, after the step A is completed, the fat edge structures 214 are formed on the periphery region 204 of the sensing strip 20 because of the surface tension. In accordance with the method of the present invention, the fat edge structures 214 are eliminated after the periphery region 204 of the sensing strip 20 is cut off. Consequently, the fingerprint identification module 1 has the aesthetically-pleasing appearance. Secondly, since the second protective layer 23 is covered on the second surface 203 of the sensing strip 20, the plural electric contact parts 1111 are protected by the second protective layer 23. Consequently, during the step E, the plural electric contact parts 1111 are not contaminated or damaged. Thirdly, the fat edge structures 214 are formed on the periphery region 204 of the sensing strip 20. The periphery region 204 indicates the peripheries of the surfaces of the sensing strip 20. For succinctness, only the fat edge structures 214 on the two lateral sides of the first surface 203 of the sensing strip 20 are shown in FIGS. 4, 6 and 7.

From the above descriptions, the present invention provides a method for assembling a fingerprint identification module. Firstly, a first spray process is performed to form a first paint structure on a first surface of a sensing strip. Then, a first surface and a second surface of the sensing strip are protected. Then, a periphery region of the sensing strip is cut. Consequently, plural fingerprint sensors are produced, and the fat edge structures generated in the first spray process are eliminated. Then, a second spraying process is performed to spray a second paint structure is sprayed on sidewalls of the plural fingerprint sensors. Consequently, the overall color of the fingerprint sensor is uniform. Then, the cut first protective film and the cut second protective layer are removed from the fingerprint sensors. After one of the fingerprint sensors is installed on a circuit board, the fingerprint identification module is produced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A method for assembling a fingerprint identification module, the method comprising steps of:
    (A) spraying a first paint structure on a first surface of a sensing strip;
    (B) covering a first protective film on the first surface of the sensing strip, and covering a second protective film on a second surface of the sensing strip;
    (C) cutting the sensing strip to produce plural fingerprint sensors;
    (D) spraying a second paint structure on sidewalls of the plural fingerprint sensors; and
    (E) removing the cut first protective film and the cut second protective layer from the fingerprint sensors.

2. The method according to claim 1, wherein after the step (E), the method further comprises a step (F) of installing one of the plural fingerprint sensors on a circuit board, so that the fingerprint identification module is produced.

3. The method according to claim 2, wherein in the step (E), a surface of the fingerprint sensor is installed on the circuit board by a surface mount technology (SMT), and an electric contact part on the surface of the fingerprint sensor is electrically connected with the circuit board.

4. The method according to claim 1, wherein in the step (B), the first protective film is adhered and covered on the first surface of the sensing strip, wherein the first protective film comprises:
    a first thin film body contacted with the first surface of the sensing strip; and
    a first adhesive layer distributed on the first thin film body, wherein the first thin film body is adhered to the first surface of the sensing strip through the first adhesive layer.

5. The method according to claim 4, wherein the first thin film body is made of polyimide (PI) or polyethylene terephthalate (PET), and the first adhesive layer is made of silicone.

6. The method according to claim 1, wherein in the step (B), the second protective film is adhered and covered on the second surface of the sensing strip to protect the electric contact part of the sensing strip, wherein the second protective film comprises:
   a second thin film body contacted with the second surface of the sensing strip and the electric contact part; and
   a second adhesive layer distributed on the second thin film body, wherein the second thin film body is adhered to the second surface of the sensing strip through the second adhesive layer.

7. The method according to claim 6, wherein the second thin film body is made of polyimide (PI) or polyethylene terephthalate (PET), and the second adhesive layer is made of silicone.

8. The method according to claim 1, wherein the step (A) comprises steps of:
   (A1) spraying a first primer layer of the first paint structure on the first surface of the sensing strip;
   (A2) spraying a first color paint layer of the first paint structure on the first primer layer; and
   (A3) spraying a first topcoat paint layer of the first paint structure on the first color paint layer.

9. The method according to claim 8, wherein the second paint structure contains a second color paint layer, wherein a color of the second color paint layer is identical to a color of the first color paint layer.

* * * * *